US008253443B2

(12) United States Patent
Robinett (10) Patent No.: US 8,253,443 B2
(45) Date of Patent: Aug. 28, 2012

(54) INTERCONNECTION ARCHITECTURES FOR MULTILAYER CROSSBAR CIRCUITS

(75) Inventor: Warren Robinett, Chapel Hill, NC (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/912,647

(22) Filed: Oct. 26, 2010

(65) Prior Publication Data

US 2012/0098566 A1  Apr. 26, 2012

(51) Int. Cl.
*H03K 19/00* (2006.01)
*H01L 25/00* (2006.01)
*H01L 21/82* (2006.01)
*H01L 21/3205* (2006.01)

(52) U.S. Cl. ......... 326/103; 438/129; 438/587; 326/101
(58) Field of Classification Search ............. 326/37–41, 326/47, 101, 103; 710/317
See application file for complete search history.

(56) References Cited

U.S. PATENT DOCUMENTS

| | | | |
|---|---|---|---|
| 6,965,137 B2* | 11/2005 | Kinney et al. | 257/295 |
| 7,352,067 B2* | 4/2008 | Fukaishi et al. | 257/777 |
| 7,588,945 B2 | 9/2009 | Min et al. | |
| 7,982,504 B1* | 7/2011 | Robinett | 326/103 |
| 2007/0194301 A1* | 8/2007 | Sezi et al. | 257/40 |
| 2010/0162067 A1* | 6/2010 | Norman | 714/746 |
| 2011/0076810 A1* | 3/2011 | Xia et al. | 438/129 |
| 2011/0127484 A1* | 6/2011 | Yasutake | 257/2 |

FOREIGN PATENT DOCUMENTS

WO  WO 2010/117355  * 10/2010

OTHER PUBLICATIONS

Dmitri B. Strukov, et al.; "Four-Dimensional Address Topology for Circuits with Stacked Multilayer Crossbar Arrays"; PNAS; Dec. 1, 2009; vol. 106; No. 48.
Dmitri B. Strukov, et al.; "Monolithically Stackable Hybrid FPGA".
Wei Lu, et al.; "Nanoelectronics From the Bottom up"; Nature Materials; Nov. 2007; vol. 6.
U.S. Appl. No. 12/696,361, filed Jan. 26, 2010 entitled "Interconnection Architecture for Multilayer Circuits".
International Patent Application No. PCT/US10/53549 filed on Oct. 21, 2010 entitled "Metal-Insulator Transition Switching Devices".

* cited by examiner

*Primary Examiner* — Shawki S Ismail
*Assistant Examiner* — Dylan White (57) ABSTRACT

An interconnection architecture for multilayer circuits includes metal-insulator transition channels interposed between address leads and each bar in the multilayer circuit. An extrinsic variable transducer selectively transitions the metal-insulator channels between insulating and conducting states to selectively connect and disconnect the bars and the address leads. A method for accessing a programmable crospoint device within a multilayer crossbar circuit is also provided.

20 Claims, 10 Drawing Sheets

INTERCONNECTION ARCHITECTURES FOR MULTILAYER CROSSBAR CIRCUITS

STATEMENT OF GOVERNMENT INTEREST

This invention has been made with government support. The government has certain rights in the invention.

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

Interconnections between a base plane and overlying circuit layers provide power, read/write access, and programming capabilities throughout the three dimensional circuit. However, these interconnections can consume valuable area within the circuit, add significant levels of complexity to the layout, and reduce the bit density of the circuit.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry. Interconnections between a base plane and the overlying circuit layers provide power, read/write access, and programming capabilities throughout the three dimensional circuit. However, these interconnections can consume valuable area within the circuit, add significant levels of complexity to the layout, and reduce the bit density of the circuit.

This specification addresses new addressing and wiring architectures for multi-layer, memristive crossbar memory. The architectures include Complimentary Metal-Oxide-Semiconductor (CMOS) circuitry, a stack of overlying circuits (such as memory-plane layers), and a wiring scheme which interconnects the CMOS-layer circuitry with the stack of overlying circuits. A baseline interconnection scheme, the "Big Bend Architecture," provides a simple and straight forward approach to interconnecting the CMOS-layer circuitry and the stack of overlying circuitry. A second illustrative approach uses MIT switches to simplify the layer select mechanism and reduce the number of interconnections by several orders of magnitude. A third illustrative approach uses MIT transistors and MIT switches to create address circuitry in the stack of overlying circuitry. This reduces the number of interconnections by several more orders of magnitude.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1A:
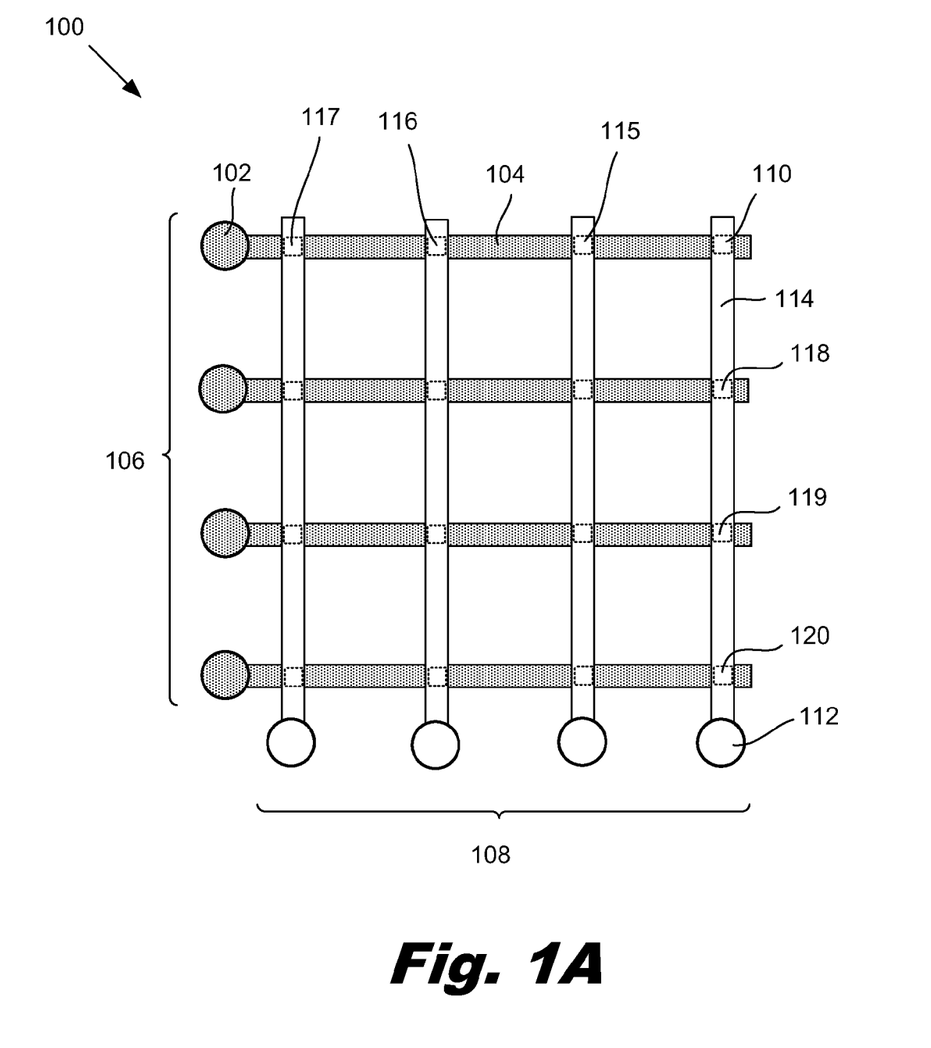
FIG. 1A-1C are diagrams of an illustrative crossbar circuit, according to one example of principles described herein.

FIG. 1 is a diagram of an illustrative crossbar circuit (100). According to one illustrative embodiment, the crossbar circuit (100) includes an east/west array of bars (106) which are intersected by a north/south array of bars (108). Each of the east/west bars (106) are made up of a via (102) and a bar (104) which is electrically attached to the via (102). A bar may be a nanowire, microwire, or larger wire. Similarly, each of the north/south bars (108) is made up of a via (112) and a bar (114). For convenience, vias which are attached to east/west bars (106) are called east/west vias (102) and vias which are attached to north/south bars (108) are called north/south vias (112). At each intersection between an east/west bar (106) and a north/south bar (108), a programmable crosspoint device (110) is sandwiched between the intersecting bars. For example, an east/west bar (104) intersects a north/south bar (114) in the upper right hand portion of FIG. 1A. A programmable crosspoint device (110) is sandwiched between the east/west bar (104) and the north/south bar (114). Although the bars (106, 108) are illustrated as making perpendicular intersections, the bars (106, 108) may intersect at any nonzero angle. Saying that two bars intersect means that they cross, when viewed from above (not that they interpenetrate), and that they are close enough, at their point of nearest approach, to form a sandwich using an intermediate layer of switching material as the "meat" and the two crossing bar as the upper and lower "buns".

To write to a specific programmable crosspoint device (110), a voltage difference applied to two vias (102, 112) which are connected to intersecting bars (104, 114). Only the programmable crosspoint device (110) which is at the intersection of the two bars (104, 114) sees the full programming voltage. Crosspoint devices (115-120) which are connected to only one of the activated bars experience either half of the full programming voltage. Crosspoint devices which only see a portion of an applied voltage because they are attached to only one activated via/bar are called "half selected." The state of the half selected crosspoint devices (115-120) does not change because they do not see the full writing voltage.

Crosspoint devices which are not connected to an activated bar do not experience a voltage difference. The unlabeled crosspoint devices in FIG. 1A are the non-selected devices; both of their bars are at a zero or other intermediate voltage, and therefore there is little or no voltage drop across them, and thus their state does not change.

To read a given crosspoint device (110), a number of techniques can be used. In one example, a reading voltage is applied to two intersecting bars (104, 114). The reading voltage is sufficiently lower than the writing voltage that there is not a significant change in the state of the programmable crosspoint devices. By applying the reading voltage and measuring the amount of current which flows through the programmable crosspoint device (110) at the intersection between the bars (104, 114), its state can be determined.

Figure 1B:
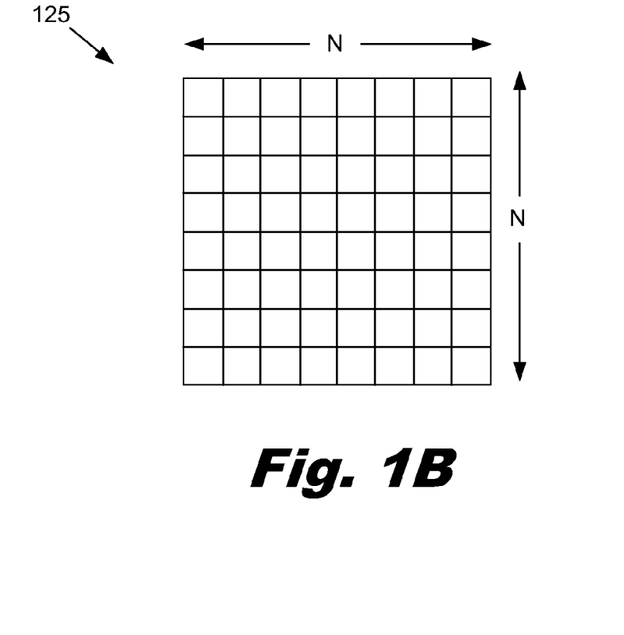
Figure 1C:
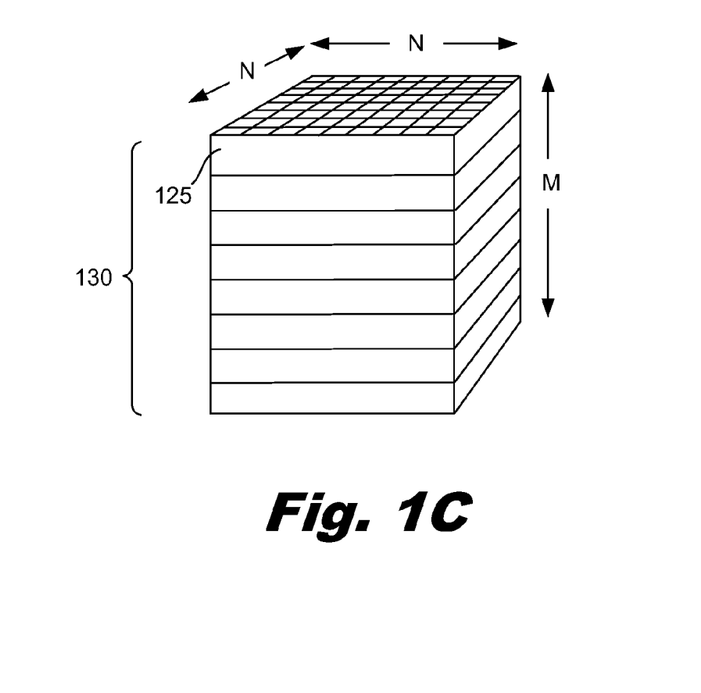

FIG. 1B is a diagram of an illustrative crossbar layer (125) which has two arrays of N nanowire bars, which intersect at $N^2$ crosspoints. FIG. 1C is a diagram of an illustrative crossbar stack (130) which is formed from M crossbar layers (125). Thus, the crossbar stack (130) contains $N^2M$ programmable crosspoint devices. As discussed below, this crossbar stack (130) can incorporate a variety of interconnection architectures such that each programmable crosspoint device is uniquely addressed and every address within a contiguous address space accesses a programmable crosspoint device.

Figure 2:
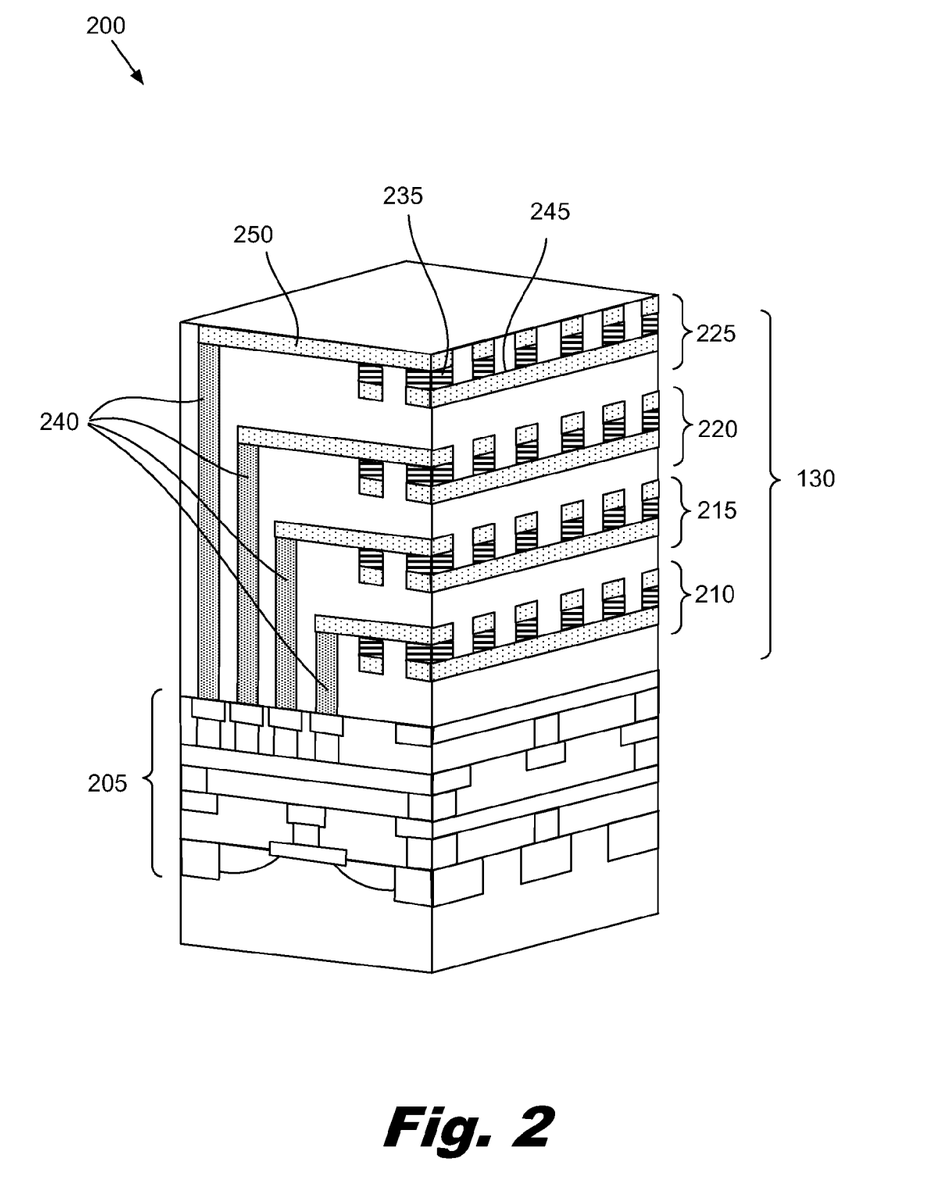
FIG. 2 is a cross-sectional diagram of an illustrative multilayer circuit which includes multiple stacked crossbar circuits, according to one example of principles described herein.

FIG. 2 is a cross sectional diagram of a multilayer circuit (200) which includes a crossbar stack (130) which is formed from multiple stacked crossbar circuit layers (210, 215, 220, 225). According to one illustrative embodiment, crossbar stack (130) overlies a CMOS layer (205). This CMOS layer (205) may provide additional functionality to the crossbar stack (130) such as input/output functions, selection using an address, buffering, logic, or other functionality. In other examples, this functionality may be incorporated directly into the crossbar stack (130) and the CMOS layer may be replaced with a planar substrate which provides mechanical support to the crossbar stack (130). A number of vias (240) provide electrical connections between the CMOS layer (205) and the programmable crosspoint devices (235) which are interposed between intersecting east/west bars (250) and north/south bars (245).

According to one illustrative embodiment, the programmable crosspoint devices (235) may be memristive devices or memcapacitive devices. Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. These changing dopant configurations within a matrix produce changes in the electrical resistance or other characteristics of the device. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

Additionally or alternatively, the programmable crosspoint devices may be memcapacitive devices. According to one illustrative embodiment, memcapacitive devices share operational similarities with memristors, except the motion of dopants within the matrix primarily alters the capacitance of the device rather than its resistance.

According to one illustrative embodiment, the multilayer circuit (200) may be used to form a nonvolatile memory array. Each of the programmable crosspoint devices (235) may be used to represent one or more bits of data. Although the bars (245, 250) are shown with rectangular cross sections, bars (245, 250) can also have square, circular, elliptical, or more complex cross sections. The bars (245, 250) may also have many different widths or diameters and aspect ratios or eccentricities.

Access transistors within the CMOS layer are relatively efficient switches with high ON/OFF ratios and can be used to create read circuits for the overlying crossbar stack (130). The read circuit is configured to ascertain the state of a selected memristor in the presence of leakage from many half-selected memristors in the crossbar layer. Since there is only one CMOS layer (205) in the multilayer circuit (200) and many crossbar layers (210, 215, 220, 225), the CMOS transistors should be carefully and efficiently utilized to access the programmable crosspoint devices. Although only four crossbar layers (210, 215, 220, 225) are shown in FIG. 2, there are strong design motivations for increasing the number of crossbar layers. For example, increasing the number of crossbar layers can increase the bit density and decrease the planar area occupied by a given component.

However, finding an acceptable interconnection wiring in the multilayer circuit (200) can be challenging. There can be a number of criteria and design goals which guide the overall design of the multilayer circuit (200). The interconnection wiring may have an influence on many aspects of the multilayer circuit design. According to one illustrative example, the following criteria and design goals can be applied to the design of a multilayer memory circuit: 1) The interconnection wiring connects multiple planes of memristor crossbar memory (stacked vertically), using only one bottom layer of CMOS circuitry. 2) The multilayer circuit design and interconnection wiring should achieve high bit density—higher than can be achieved without multiple planes. 3) The multilayer circuit design and interconnection wiring should adequately handle practical electrical engineering issues such as wire resistance, wire capacitance, leakage through non-selected and half-selected memristors, etc. 4) The multilayer circuit design should be competitive in terms of speed and power consumption. 5) The multilayer circuit design should provide read and write circuitry which is compatible with the crossbar structures, and with a range of programmable crosspoint devices including memristive devices. 6) The multilayer circuit design should minimize, to the extent possible, the number of layers, processing steps, and masks required to fabricate the multi-layer memory chip. This reduction in manufacturing complexity can reduce the cost to form the multilayer circuits. 7) The multilayer circuit design provides a memory which, as seen externally, has a one-to-one mapping between addresses and physical memory cells (memristors)—that is, a memory which is dense (there are no holes in the address space), and in which the physical bits are uniquely addressed (there are no memristors with multiple addresses, and no addresses which activate multiple memristors). As used in the specification and appended claims the term "address space" refers to a range of discrete addresses assigned to programmable crosspoint devices within a multilayer circuit. 8) The multilayer circuit design provides a memory system architecture which is compatible with the standard techniques for improving memory chip yield, such as the use of error-correcting codes (ECC) and the use of a locate-and-avoid technique, which locates defects and replaces the defects with redundant resources. 9) The multilayer circuit design minimizes the overhead incurred by vias, inter-layer wiring, decoders, etc., so as to approach as closely as possible, for the global density, the inherent maximum local density of the memristive crossbar array. For example, for a memristive crosspoint device, the maximum local density may be 1 bit per $(3F)^2$, where F is the minimum lithographic feature size.

The criteria and design goals listed above are not exhaustive. Further, meeting each of the criteria and design goals is not required. A number of desirable interconnection architectures could be created which may not meet all of the criteria and design goals. Additionally, performance of the multilayer circuit in one category may be reduced to produce a resulting gain in another design category. The crossbar layers may be formed using a variety of methods which produce different and typically smaller feature sizes than conventional lithography. The principles below taught could be used in conjunction with a variety of manufacturing processes.

Further, the descriptions herein are not intended to be exhaustive or to limit these principles to any precise form disclosed. Many modifications and variations are possible in light of the above teaching. For example, the structure of the layers, the number of layers, and routing in some multilayer circuits may be significantly more complex and may require more masks and interconnections than the illustrated embodiment.

The Big Bend Architecture

Figure 3A:
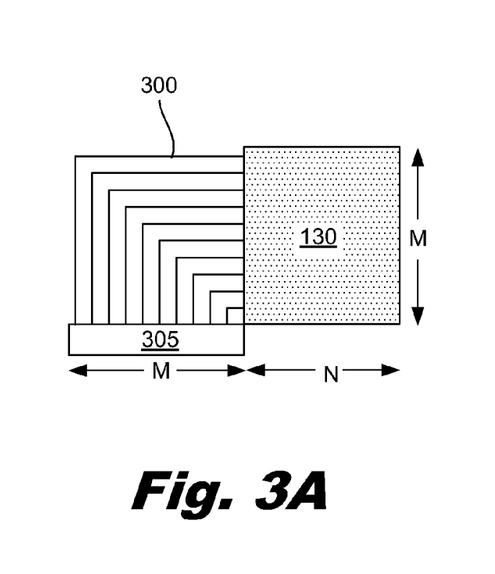
FIGS. 3A-3C are diagrams of an illustrative interconnection architecture which connects underlying Complimentary Metal-Oxide-Semiconductor (CMOS) circuitry to crossbars in a multilayer circuit, according to one example of principles described herein.
Figure 3B:
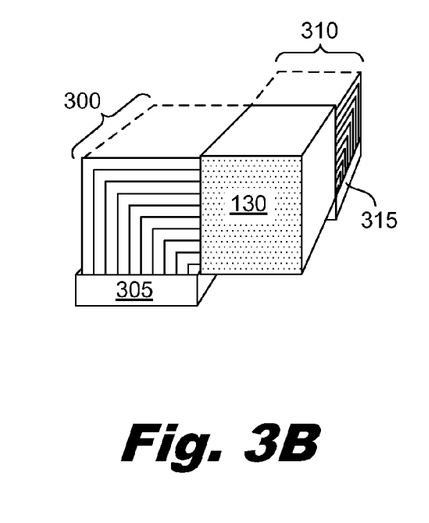
Figure 3C:
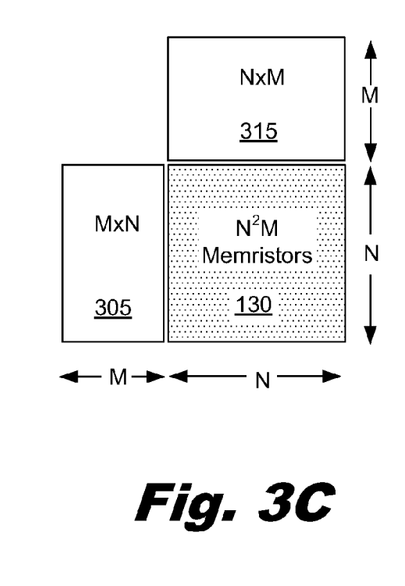

FIGS. 3A-3C show one illustrative embodiment of the Big Bend Architecture. The Big Bend Architecture is an addressing scheme which serves as a baseline for comparison of other addressing schemes presented below.

FIG. 3A is a side view of one slice of an illustrative multilayer circuit which incorporates the Big Bend wiring scheme (300). According to one illustrative embodiment, N memristors are attached to each bar, which results in an N×N crossbar array with $N^2$ memristors. These crossbar arrays (also called memory planes or layers) are used as a building block for the crossbar stack (130). The crossbar stack (130) includes a stack of M layers of these N×N crossbar arrays. Each layer has N north/south nanowires and N east/west nanowires, which adds up, for all M layers, to 2NM nanowires. A dedicated via for each of these 2NM nanowires is provided in the CMOS layer (205). The Big Bend wiring scheme (300) is a simple, non-overlapping wiring scheme to route a 2D array of N×M west vias coming up out of the CMOS via array (305) to N east/west bars coming out of the side of each layer in the crossbar stack (130). Each of the M layers of the crossbar stack (130) is an N×N crossbar array. The vias/conductors are bent 90 degrees to feed into the side of the stack of M layers and connect to the bar coming out of the side of each layer.

FIG. 3B is a perspective view of an illustrative multilayer circuit which incorporates the Big Bend wiring scheme (300, 310). FIG. 3B shows Big Bend wiring (300, 310) which makes connections between a west CMOS 2D via array (305) and a north CMOS 2D via array (315) and the crossbar stack (130). FIG. 3C is a plan view of the west CMOS via array (305), the north CMOS via array (315), and the crossbar stack (130). In this illustrative embodiment, the crossbar stack (130) includes M layers of N×N memristors each. The CMOS via arrays (305, 315) are formed with M×N or N×M vias such that each column of N vias in the west CMOS via array (305) connect with their respective N east/west bars for each of the M layers. Similarly, the N vias in each row of the north CMOS via array (315) connect to their respective N north/south bars for each of the M layers. Consequently, by accessing one west via and one north via, a memristor is uniquely addressed for read and write operations. In the Big Bend wiring scheme, the two vias must be chosen such that they access the same layer.

The Big Bend wiring scheme (300, 310) has the following characteristics. First, the Big Bend wiring scheme (300, 310) is a simple geometric structure which incorporates a large number of vias in order to reduce the number of memristors connected to each via. Each of the M crossbar arrays is electrically isolated from the other layers and is accessed only from the CMOS layer (305, 315). The CMOS layer (305, 315) is being utilized relatively effectively because the access transistors in the CMOS layer are laid out in a dense 2D grid driving the upward-going vias.

According to one illustrative embodiment, the raw address for a given memristor in the M crossbar layers consists of three coordinates: Y which designates which via in the N direction in the west CMOS (305) via array is selected, X which designates which via in the E direction of the north CMOS (315) via array is selected, and Z which designates which layer within the M crossbar layers is selected. The Z coordinate is the same for both the west and the north via arrays. Thus Y, Z coordinates select an east/west bar connected to the specified west via and X,Z coordinates select a north/south bar connected to the specified north via. Only the memristor in the intersection of the east/west bar and the north/south bar is accessed for reading or writing. This is the selected memristor. Consequently, the address (X, Y, Z) uniquely address all memristors in the multilayer circuit and there are no holes in the addressing space.

For purposes of illustration, the following numeric example will be used. In this numeric example, there are 2048 programmable junctions along each side of the N×N matrix ($N=2^{11}$). There are 64 layers in the multilayer circuit ($M=2^6$). This results in a total of 268,435,456 programmable crosspoint devices ($N \times N \times M = 2^{28}$). Using the Big Bend architecture, the $2^{28}$ crosspoint devices are accessed through 2NM vias ($2 \times 2^6 \times 2^{11} = 2^{18} = 262{,}144$ vias). As shown in FIG. 3C, these vias may be divided into two or more groups which are distributed around and/or under the multilayer stack (130). This relatively large number of vias can consume a significant amount of space and may reduce the bit density of the circuit. However, the Big Bend architecture is a straight forward implementation.

There are number of alternative wiring configurations which can be used. The Big Bend architecture is only one illustrative example in a parameterized family of solutions. These solutions allow the following independent parameters to be varied: the number of memory-plane layers (M), the width of the crossbar array (N), and a via-redundancy factor (R). The Big Bend architecture represents a non-redundant (R=1) instance in which fully-populated "4D addressing" is provided, with 2NM vias accessing $N^2M$ memristors.

For the R>1 subspace, the number of vias is increased by the factor R, reducing the number of memristors accessible from each via in order to provide better read-circuit performance. For all instances in this family of solutions, there is a one-to-one correspondence between addresses and physical memory cells (memristors), and thus no holes in the address space. The 3D wiring structure is geometrically simple and provides the ability to scale the number of programmable crosspoint devices connected to each via independent of the crossbar width N and the number of layers M.

Other members of this parameterized family increase the number of memristors attached to each via by systematically collapsing ("squashing") the wiring together so that each via drives multiple memory planes (R<1). If properly performed, the unique addressing property of the wiring architecture is preserved, while the number of vias is reduced. All of these wiring schemes produce fully populated 4D addressing with no holes in the address space.

Metal Insulator Transition Devices

Figure 4A:
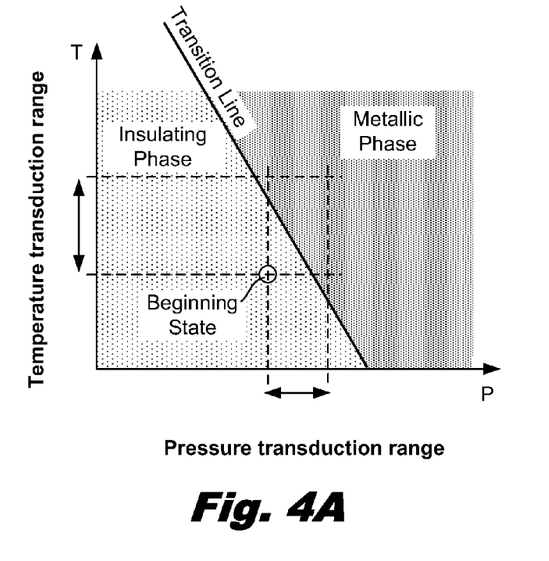
FIGS. 4A-4C are diagrams of operational principles and implementation of an illustrative metal-insulator transition (MIT) switch, according to one example of principles described herein.
Figure 4B:
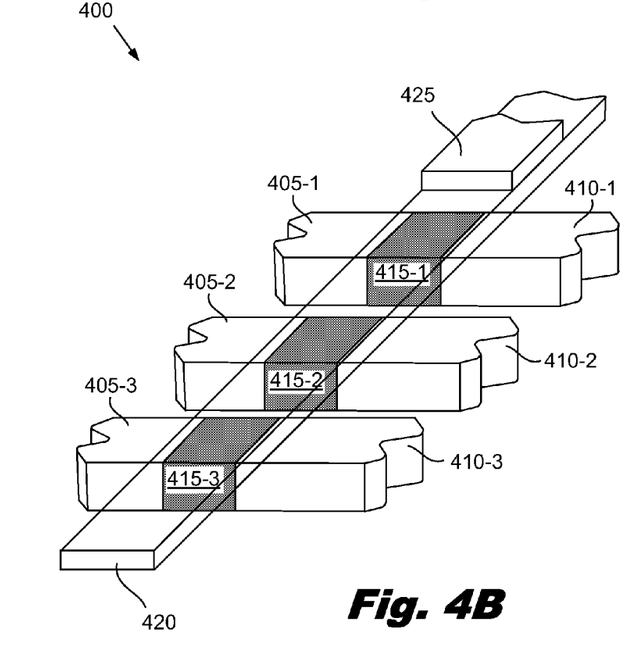
Figure 4C:
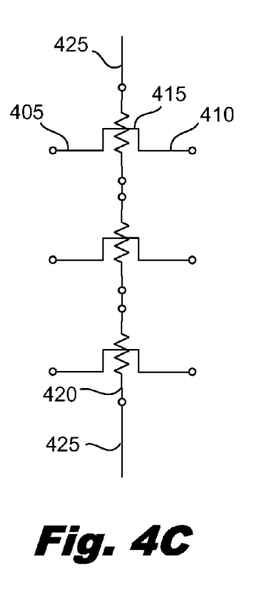

FIGS. 4A-4C are diagrams of the operational principles and implementation of an illustrative metal-insulator transition (MIT) switch. Materials which exhibit a metal-insulator transition have at least two states: an electrically insulating state and a metallic conductive state. Examples of materials which exhibit metal-insulator transitions are transition metal oxides such as vanadium oxides, magnesium oxides, titanium oxides, and others. The MIT materials can be selectively transitioned between their insulating and metallic states through manipulation of an extrinsic variable. As used in the specification and appended claims, the term "extrinsic variable" refers to an external stimulus which influences the metal-insulator transition of an MIT material. The transition of the MIT material between an electrical insulator and an electrical conductor can be a very sharp function of the extrinsic variable. Pressure, temperature and magnetic fields are examples of extrinsic variables which may influence the transition of an MIT material between insulating and metallic state.

FIG. 4A is a graph which shows the phase change of MIT material as a function of pressure and temperature. Temperature changes are shown in the vertical axis of the graph, with higher temperatures being higher on the axis. Pressure changes are shown along the horizontal axis of the graph, with greater pressures being toward the right side of the graph. According to one example, the temperature and pressure changes are produced by transducers which convert electrical energy into changes in temperature or pressure. By way of example and not limitation, a resistance heater may be used as a temperature transducer and a piezoelectric element may be used as a pressure transducer. A variety of other mechanisms could be used to control the behavior of the MIT material. For example, residual stresses could be created around and in the MIT material during a manufacturing process. These residual stresses act as pressures which alter the behavior of the MIT material.

As shown in FIG. 4A, a change in temperature produced by the transducer may transition an MIT material from an insulator phase to metallic phase, or vice versa. Dashed lines show the ranges of pressure and temperature changes in the MIT material that are produced by electrically activating the transducers. The dashed box formed by the intersection of lines illustrates the range of MIT states that pressures and/or temperatures in the ranges can produce. In this example, an increase in temperature drives the state of the MIT material vertically upward. As the state passes over the transition line between the insulating phase and into the metallic phase, the MIT material becomes substantially more conductive. Similarly, increases in pressure drive the MIT material to the right and across the transition line into the metallic phase. The combination of temperature and pressure changes within the ranges shown can move the MIT material from its beginning state to any state within the dashed rectangle. Consequently, it is clear that the MIT material may be induced to change from an insulator state to a metallic state by changes in pressure alone, change in temperature alone, or a combination of changes in both pressure and temperature.

For example, a change of a few degrees in the temperature of the MIT channel can result the state of the MIT channel crossing the transition line and decrease or increase in the electrical resistance of several orders of magnitude. Temperature changes of tens of degrees can result in increases or decreases of four to six orders of magnitude in resistance. The transition temperature and the sharpness of transition may be influenced by a variety of factors, including the type of MIT material, number of defects in the MIT material, and the degree of crystallinity of the MIT material. In general, the more crystalline the MIT material, the sharper the transition between the metallic and insulator states.

FIG. 4B shows a perspective view of an illustrative metal insulator transition switching device (400). A number of MIT channels (415) are interposed between the left electrodes (405) and the right electrodes (410). Over the MIT channels (415) an extrinsic variable transducer (420) has been formed. A gate electrode (425) is connected to the extrinsic variable transducer (420). As discussed above, the MIT channels (415) have at least two distinct states: an insulating state and a metallic state. When the MIT channels (415) are in an insulating state, the left electrodes (405) are isolated from the right electrodes (410). When the MIT channels (415) are in a metallic state, it creates an electrically conductive bridge between the left electrodes (405) and the right electrode (410).

To change the state of the MIT channels (415), the gate electrode (425) is electrically activated. This controls the extrinsic variable transducer (420) which converts the electrical energy into an extrinsic variable which influences the transition of the MIT channels (415) between their insulating and metallic states. The large change in resistance of the MIT channels (415) acts as a switch between the left electrodes (405) and the right electrodes (410). As discussed above, this MIT switching device (100) could have a number of advantages including simplicity of operation and construction, small size, low power requirements, and the ability to be readily integrated into a number of different electronic devices.

In this example, a single gate electrode (425) and transducer (420) control multiple switches. A number of other configurations could be used. For example, the MIT channels (415) could be controlled individually by a number of separate gate electrode/transducers.

FIG. 4C is a schematic representation of the MIT switching device illustrated in FIG. 4B. In this example, the transducer (420) is an electrical heater and is represented as series resistances over the MIT channels (415). The MIT channels (415) are illustrated as a raised line between the left and right electrodes (405, 410). Thus, each thermally switched MIT device can be represented as a four terminal device, with a resistive element overlaying a MIT channel. In this example, three MIT devices are arranged in series and are turned on and off together by controlling the electrical current which is passed through the transducer (420).

The embodiments described above are only illustrative examples. The MIT switching devices can be used in a variety of circuits, configurations, and be combined with a wide range of other electrical devices to perform a desired function. The MIT switching devices do not require crystalline substrates and thus can be formed on a variety of substrates. These switching devices can be used in a broad range of applications, including flexible displays and multiplexer/demultiplexer circuits in planes of a multilayer memory. The MIT channel is inherently scalable because the metal-insulator transition is a bulk effect and consequently does not suffer from problems with dopant distributions on the nanoscale. The simplicity of the manufacturing process can potentially lead to low cost implementation of the metal-insulator transition switching devices. Further, the manufacturing process is scalable because there the electrode intersections and channel do not require precise alignment.

Figure 5A:
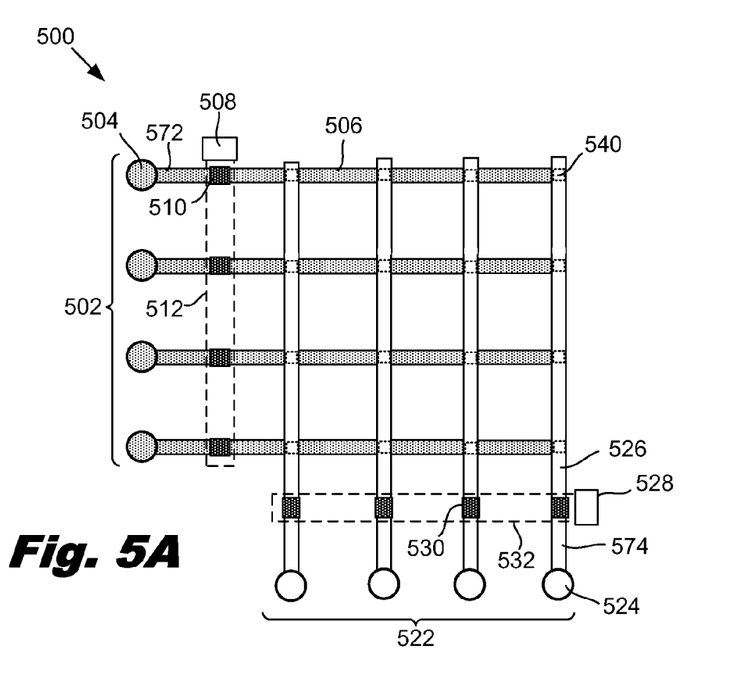
FIGS. 5A-5B are diagrams of an illustrative multilayer circuit which uses MIT switches to reduce the number of interconnections between a base layer and overlying layers, according to one example of principles described herein.
Figure 5B:
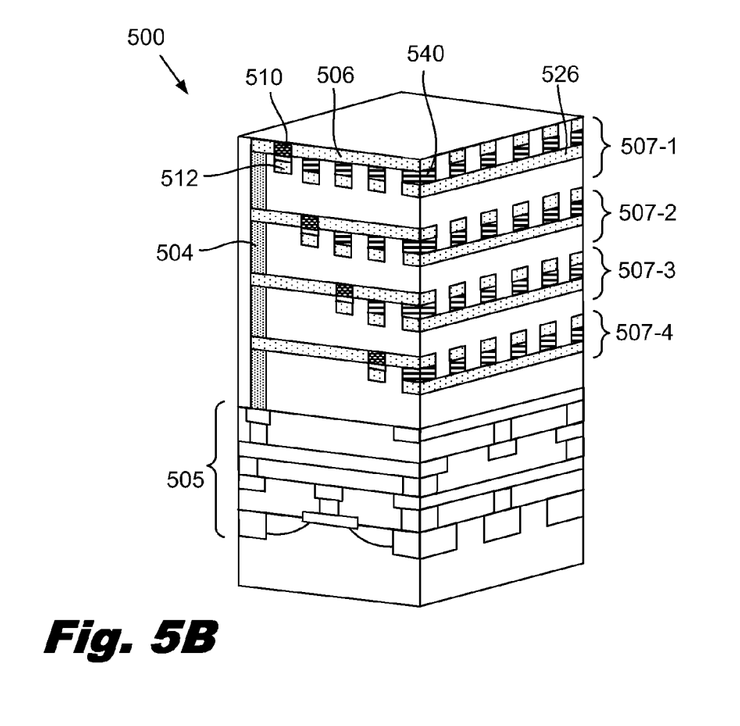

FIGS. 5A-5B are diagrams of an illustrative multilayer circuit (500) which uses MIT switches to reduce the number of interconnections between a base layer (505) and overlying layers (507). FIG. 5A is a plan view of one layer of the multilayer circuit (500). As discussed above with respect to FIG. 1A, the crossbar circuit (500) includes an east/west array (502) of bars (506) which are intersected by a north/south array (522) of bars (526). Each of the east/west bars (506) are connected to a via (504). Similarly, each of the north/south bars (526) are connected to a via (524). At each intersection between an east/west bar (506) and a north/south bar (526), a programmable crosspoint device (540) is sandwiched between the intersecting bars.

The MIT switching channels (510, 530) are interposed between each address lead (572, 574) and each of the bars (506, 526). As used in the specification and appended claims, the term "address leads" is used broadly and refers to electrical conductors which are directly attached to addressing logic or to electrical conductors which are attached to addressing logic through vertical vias. Address leads may carry a wide range of electrical signals, including binary signals and analog signals and utilize a variety of address encodings, including binary addressing (in which N bits represent $2^N$ different addresses) and unary (or 1-of-N) addressing (in which N bits represent N different addresses).

The state of the MIT switching channels (510, 530) is controlled by extrinsic variable transducers (512, 532) which are illustrated as dashed rectangles. The extrinsic variable transducers (512, 532) selectively transition the metal-insulator channels between insulating and conducting states to connect and disconnect the bars (572, 574) and the address leads (572, 574). A single extrinsic variable transducer (512) and its associated layer access gate (508) control all the MIT switching channels (510) in the east/west bars (506). Similarly, a single extrinsic variable transducer (532) and its associated layer access gate (528) control all the MIT switching channels (530) in the north/west bars (526).

FIG. 5B shows a perspective cross sectional view of a portion of an interconnection architecture within the multilayer circuit (500). The crossbar arrays (507) are formed on a base layer (505). In this example, there are only four crossbar arrays (507) illustrated but there may be more or less crossbar layers in a given multilayer circuit. Because the MIT switching devices can selectively access any given layer, there is no need for a separate via for each bar in each layer. Instead, a single via (504) can connect to bars (506) in each layer. To address a given programmable crosspoint device, the correct east/west via and north/south via are activated. The layer select gates (508, 528; FIG. 5A) are then activated to close the crossbar connections in the appropriate crossbar layer. The layer select gates (508, 528; FIG. 5A) control the extrinsic variable transducers (512, 532) which alter the state of the MIT channels from an insulating state to a conducting state or vice versa. This selectively transitions the metal-insulator channels between insulating and conducting states to selectively connect and disconnect the bars and the addressing circuitry and allows electrical current to flow through the appropriate east/west (506) and north/south (526) bars to access the desired crosspoint device (540). As used in the specification and claims, the term "addressing circuitry" is used broadly and includes CMOS access circuitry in a base layer, vias passing from the CMOS access circuitry into the multilayer circuit, and any multiplexer/demultiplexer circuitry which may be included in the multilayer circuit.

In addition to MIT channels which are interposed between address leads and bars in a crossbar array, a variety of other electrically controlled switches could be used. For example, memristors could be used to selectively connect an address leads to bar in the crossbar array. Memristors have a low resistance state when mobile dopants are spread through the memristive matrix and a high resistance state when the mobile dopants are moved to a concentrated area within the matrix. Thus, memristors form an electrically controlled switch which can be used to selectively connect and disconnect an address lead from a bar in a crossbar array. Additionally or alternatively, thin film transistors can be formed in the upper layers of the crossbar circuits. These thin film transistors can be electrically controlled to selectively connect and disconnect address leads from bars in a crossbar array.

Figure 6A:
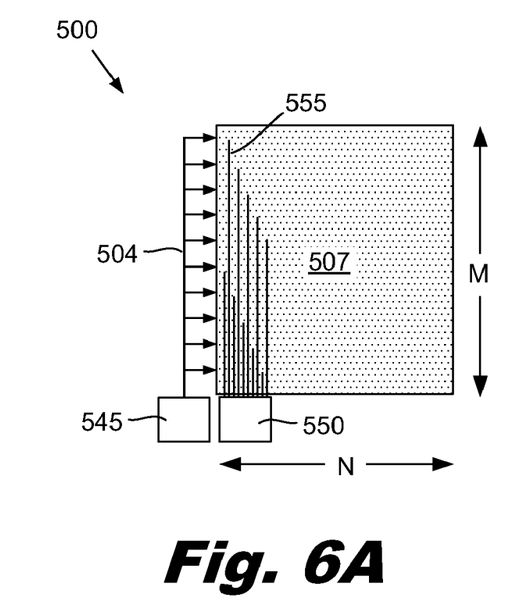
FIGS. 6A-6B are diagrams of an illustrative multilayer circuit which uses MIT switches to reduce the number of interconnections between a base layer and overlying layers, according to one example of principles described herein.
Figure 6B:
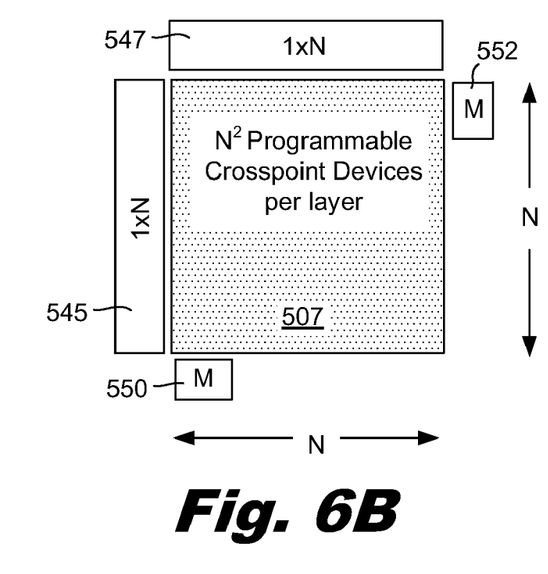

FIGS. 6A-6B are additional diagrams of an illustrative interconnection architecture used in the multilayer circuit (500) which is shown in FIGS. 5A-5B. FIG. 6A is a side view of the multilayer circuit (500) and FIG. 6B is a plan view of the multilayer circuit (500). Compared with the Big Bend architecture, the multilayer circuit which incorporates MIT switching devices utilizes a significantly smaller number of vias and CMOS access circuits. Because each north/south via (504) and each east/west via (524) connects to bars in each crossbar array, only N north/south vias and N east/west vias (524) are required. There are two layer access gates for each layer, resulting in 2M additional vias (555). As shown in FIG. 6B, the N north/south vias and N east/west vias can be arranged in a 1×N array along two adjacent sides of the crossbar stack. The M east/west vias and M north/south vias are grouped together near the edge adjacent to the respective 1×N array. For this illustrative interconnection scheme, the total number of vias is 2N+2M.

Returning to the numeric example above, where there are 2048 programmable junctions along each side of the N×N matrix ($N=2^{11}$) and 64 crossbar layers ($M=2^6$) in the multilayer circuit. This results in a total of 268,435,456 programmable crosspoint devices (N×N×M=$2^{28}$). These $2^{28}$ crosspoint devices are accessed through 2N+2M vias ($2×2^{11}+2×2^6=2^{13}=8192$ vias). This is a reduction in the number of vias of approximately two orders of magnitude. As a result, the bit density for this design can be significantly higher than for the Big Bend or other architectures which have a higher number of vias. Further, the overall foot print of the multilayer circuit is reduced.

Figure 7A:
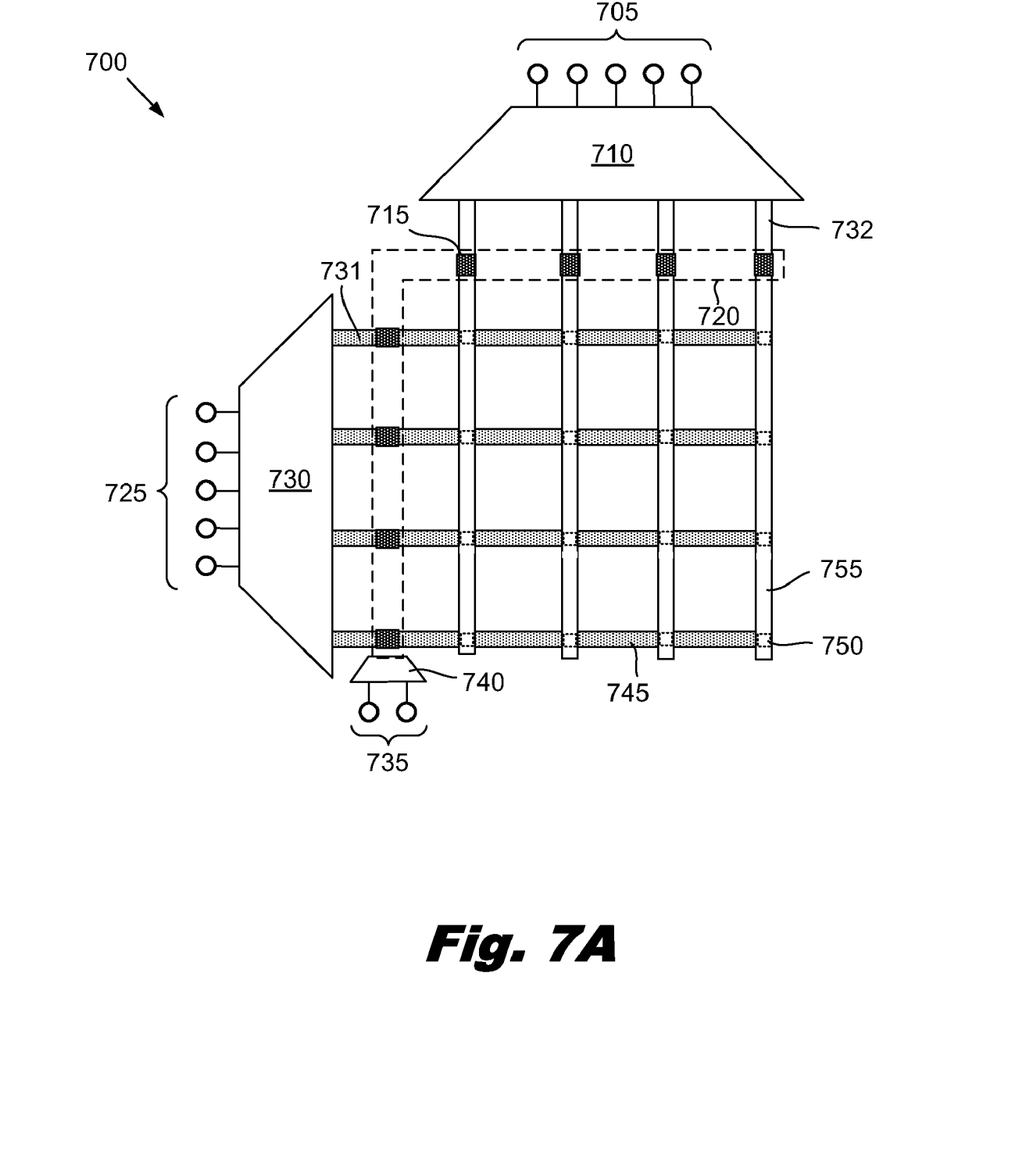
FIGS. 7A and 7B are diagrams of an illustrative multilayer circuit which incorporates MIT transistors and switches to reduce the number of interconnections between a base layer and overlying layers, according to one example of principles described herein.
Figure 7B:
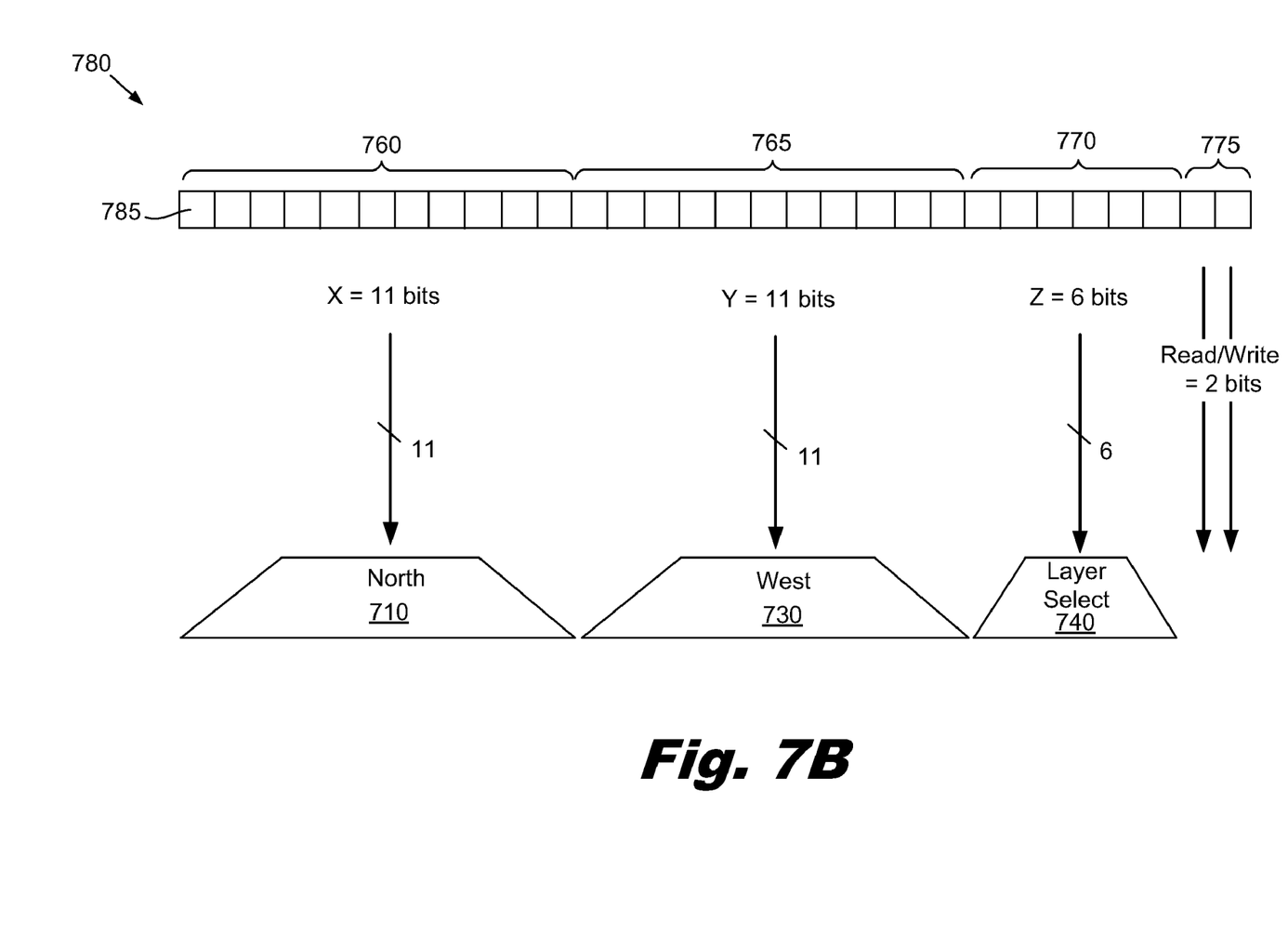

FIGS. 7A and 7B are diagrams of an illustrative multilayer circuit (700) which incorporates MIT transistors and switches to further reduce the number of interconnections between a base layer and overlying layers. In these illustrative embodiments, MIT transistors are used to form demultiplexer addressing circuitry (710, 730, 740) in each layer. According to one embodiment, MIT transistors work on similar principles as described above with respect to MIT switches. There are a variety of ways in which MIT devices could be configured to form logic within crossbar layers. For example, an MIT device which turns ON when heated is analogous to a NPN which turns ON when a more positive voltage is applied to its gate. To directly build logic circuits in the style of CMOS logic (which uses both PNP and NPN transistors), MIT devices of two kinds would be needed—a kind that turn OFF when the voltage is applied, and another kind that turn ON when voltage is applied. This can be accomplished, in effect, by doubling the number of vias used to form complementary pairs. The signal and its logical complement are computed in the CMOS layer and sent upward on a pair of vias; this pair is called a complementary pair. This allows the MIT devices, which operate as described above, to be substituted for both PNP and NPN devices. Since putting logic in the memory planes has been shown to reduce the number of vias needed by a large factor, this factor of two increase in the number of vias is acceptable. This simple technique is one illustrative method that can be used to create arbitrary logic with MIT devices as they are describe above.

Additionally or alternatively, the logic circuitry could be formed in the multilayer circuit using any transistor-like electrically controlled switch. For example, thin film transistors, memristors, or other electrically controlled switches could be used to fill the role of conventional CMOS transistors.

FIG. 7A is a plan view of a portion of a crossbar layer (700) within a multilayer circuit. In this example, a number of address vias (705, 725, 735) are connected to demultiplexer addressing circuitry (710, 730, 740) which is formed in the layer. A west demultiplexer (730) accepts a binary address through address vias (725). Based on the binary address the west demultiplexer (730) activates one of the east/west address leads (731). Similarly, the north demultiplexer (710) accepts a binary address through address vias (705) and activates one of north/south address leads (732). The layer select circuit (740) accepts a binary address through address vias (735). If the binary address matches the address of the layer, the layer select circuit activates an extrinsic variable transducer (720). As discussed above, the extrinsic variable transducer (720) alters the state of MIT channels (715) to connect the bars to the address leads (731, 732). When the appropriate layer and bars are selected, the desired programmable crosspoint device (750) can be addressed.

As shown above, incorporating addressing circuitry within each layer allows the number of vias connecting the base layer to the overlying crossbar layers to be further reduced. FIG. 7B shows one illustrative addressing scheme (780). This addressing scheme (780) can be applied to the numeric example described above. In this example, the addressing scheme (780) is used to address a 64 layer circuit where N=2048 and each layer has $N^2$ programmable crosspoint devices. The addressing scheme (780) uses 30 vias to communicate a 28 bit address (760, 765, 770) from the base layer to the addressing circuitry in each layer. The 28 bit address is used to selectively access any of the $2^{28}$ programmable crosspoint devices. The two additional vias/lines are used to perform read/write operations in the multilayer circuit.

In this example, the first 11 lines (760) are used to communicate an 11 bit address to the north demultiplexer (710). This allows the north demultiplexer (710) to select one of 2048 north/west bars. When a given address is received, the north demultiplexer activates the appropriate north/west bar in each of the 64 layers. The second 11 lines (765) are attached to the west demultiplexer (730) which selects the one of the 2048 east/west bars. The west demultiplexer (730) also activates the appropriate east/west bar in each of the 64 layers.

To direct the desired operation to only one of the programmable cross point devices in the multilayer circuit, the layer select circuit (740) is used. The layer select circuit (740) connects the bars in only one layer to the output of the north and west demultiplexer in that layer. In this manner, only each of the programmable crosspoint devices in the multilayer circuit can be uniquely addressed using the 28 bit address. In other embodiments, a set of bits (a word) could be written or read in parallel, with one bit to each memory plane. One method of reading and writing words in parallel is to have a number of vias which is equal to the number of memory plane layers. For example, if the number of memory planes is 64 (M=64) then there are 64 data vias, with one via connected to each memory plane. Each of these data vias carries one bit to or from a particular memory plane. Two additional vias, a Read Enable via and a Write Enable via also go to each plane. This configuration allows each plane to operate independently and in parallel with other planes. All 64 layers could perform read or write operations simultaneously. The 64 data vias are bi-directional, conveying a signal down to the CMOS read circuitry during a read operation, but carrying the data bit to be written up to its plane from the CMOS during a write operation.

Figure 8:
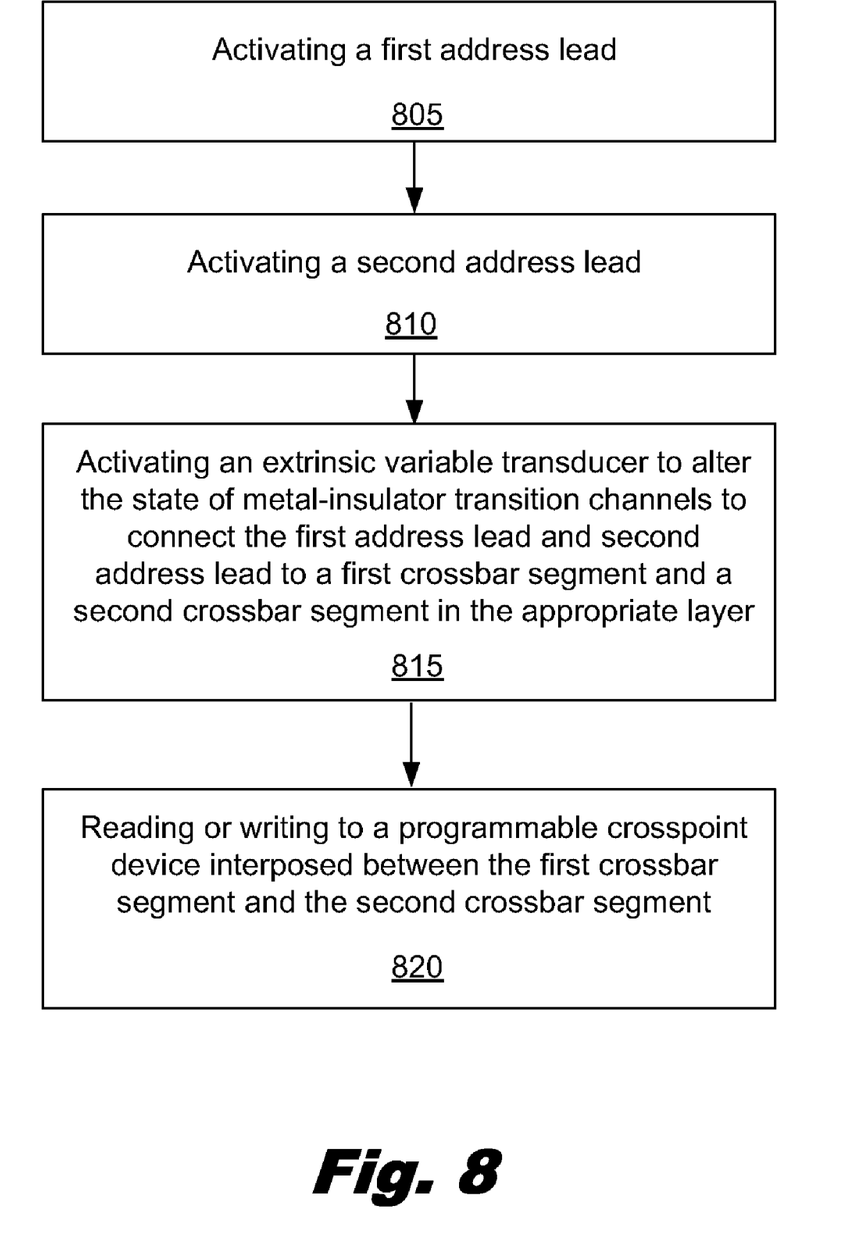
FIG. 8 is a flow chart of an illustrative method for accessing a programmable crosspoint device in a multilayer crossbar circuit, according to one example of principles described herein.

FIG. 8 is a flow chart of an illustrative method for accessing programmable crosspoint devices within a multilayer crossbar circuit. First and second address leads in each layer of the multilayer crossbar circuit are activated (805, 810). This may be accomplished in a variety of ways, including using CMOS circuitry in a base layer to access vias extending upward through the multilayer circuit or using addressing circuitry in the multilayer crossbar circuit layers.

An extrinsic variable transducer in one layer is activated (815). The extrinsic variable transducer alters the state of metal-insulator transition channels interposed between address leads and crossbar segments in that layer such that electrical signals from first and second address leads are conducted to a first crossbar segment and a second crossbar segment. A programmable crosspoint device which is interposed between the first crossbar segment and second crossbar segment can then be accessed for reading or writing (820).

In conclusion, the interconnection architectures for multilayer crossbar circuits which incorporate MIT channels can significantly reduce the number of address vias and address lines between a base layer and overlying layers. This can decrease the size and complexity of the circuit while simultaneously increasing the bit density within the circuit.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:
1. An interconnection architecture for multilayer crossbar circuits comprises:
   metal-insulator transition channels interposed between address leads and each bar in a multilayer crossbar circuit; and
   an extrinsic variable transducer that selectively transitions the metal-insulator transition channels between insulating and conducting states to selectively connect and disconnect the bars and the address leads, in which the extrinsic variable transducer comprises a layer select device that connects at least a portion of the bars in a selected layer to addressing circuitry, wherein the extrinsic variable transducer is either an electrical heater or a pressure transducer.

2. The architecture of claim 1, in which the extrinsic variable transducer converts an electrical signal from a gate electrode into a change in an extrinsic variable, the extrinsic variable changing the state of the metal-insulator channels between insulating and conducting states.

3. The architecture of claim 1, in which a single extrinsic variable transducer is a layer selected device which connects all the bars in a selected layer to addressing circuitry.

4. The architecture of claim 1, further comprising addressing circuitry is distributed in multiple crossbar layers which overlie a base layer.

5. The architecture of claim 4, in which the addressing circuitry is formed from complementary pairs of vias which connect to metal insulating transition devices configured as logic circuitry.

6. The architecture of claim 4, in which the architecture further comprises:
a first group of vias which address north/south bars;
a second group of vias which address east/west bars; and
a third group of vias which address layers within the multilayer crossbar circuit.

7. The architecture of claim 1, in which the metal-insulator transition material is crystalline vanadium oxide which has a metal insulator transition temperature between approximately 60° C. and 70° C.

8. The architecture of claim 1, in which the metal-insulator transition channels are formed along the periphery of each layer, a single extrinsic variable transducer being actuated to transition all the metal-insulator transition channels in that layer from an insulating to a conducting state and vice versa.

9. An interconnection architecture for multilayer circuits comprising:
an array of vias;
a CMOS layer configured to selectively access the array of vias according to an address;
a crossbar stack comprising layers of intersecting bars with programmable crosspoint devices interposed between intersecting bars;
electrically controlled switches comprising metal insulator channels interposed between address leads and bars in the multilayer circuit; and
an extrinsic variable transducer that selectively transitions the metal-insulator channels between insulating and conducting states, the extrinsic variable transducer comprising a layer select device that connects at least a portion of the bars in a selected layer to addressing circuitry through the array of vias, wherein the extrinsic variable transducer is either an electrical heater or a pressure transducer.

10. The architecture of claim 9, in which the metal-insulator channels comprise memristors interposed between address leads and bars in the multilayer circuit.

11. A method for accessing a programmable crosspoint device within a multilayer crossbar circuit, the method comprising:
activating first and second address leads in each layer of the multilayer crossbar circuit;
activating an extrinsic variable transducer in one layer, the extrinsic variable transducer altering the state of metal insulator transition channels interposed between address leads and crossbar segments in that layer such that electrical signals from the first and second address leads are conducted to a first crossbar segment and an intersecting second crossbar segment, a programmable crosspoint device being interposed between the first crossbar segment and second crossbar segment, wherein the extrinsic variable transducer is either an electrical heater or a pressure transducer.

12. An interconnection architecture for multilayer crossbar circuits comprises:
metal-insulator transition channels interposed between address leads and each bar in a multilayer crossbar circuit; and
an extrinsic variable transducer that selectively transitions the metal-insulator transition channels between insulating and conducting states to selectively connect and disconnect the bars and the address leads, in which the extrinsic variable transducer comprises a layer select device that connects at least a portion of the bars in a selected layer to addressing circuitry,
wherein the metal-insulator transition channels are formed along the periphery of each layer, a single extrinsic variable transducer being actuated to transition all the metal-insulator transition channels in that layer from an insulating to a conducting state and vice versa.

13. The architecture of claim 12, in which the extrinsic variable transducer converts an electrical signal from a gate electrode into a change in an extrinsic variable, the extrinsic variable changing the state of the metal-insulator channels between insulating and conducting states.

14. The architecture of claim 12, in which the extrinsic variable transducer is an electrical heater.

15. The architecture of claim 12, in which the extrinsic variable transducer is a pressure transducer.

16. The architecture of claim 12, in which a single extrinsic variable transducer is a layer selected device which connects all the bars in a selected layer to addressing circuitry.

17. The architecture of claim 12, further comprising addressing circuitry is distributed in multiple crossbar layers which overlie a base layer.

18. The architecture of claim 17, in which the addressing circuitry is formed from complementary pairs of vias which connect to metal insulating transition devices configured as logic circuitry.

19. The architecture of claim 17, in which the architecture further comprises:
a first group of vias which address north/south bars;
a second group of vias which address east/west bars; and
a third group of vias which address layers within the multilayer crossbar circuit.

20. The architecture of claim 12, in which the metal-insulator transition material is crystalline vanadium oxide which has a metal insulator transition temperature between approximately 60° C. and 70° C.

* * * * *